US012085965B2

(12) United States Patent
Aderhold et al.

(10) Patent No.: US 12,085,965 B2
(45) Date of Patent: Sep. 10, 2024

(54) SYSTEMS, METHODS, AND APPARATUS FOR CORRECTING THERMAL PROCESSING OF SUBSTRATES

(71) Applicant: Applied Materials, Inc., Santa Clara, CA (US)

(72) Inventors: Wolfgang R. Aderhold, Cupertino, CA (US); Abhilash J. Mayur, Salinas, CA (US); Yi Wang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 17/463,177

(22) Filed: Aug. 31, 2021

(65) Prior Publication Data
US 2023/0069444 A1    Mar. 2, 2023

(51) Int. Cl.
| | | |
|---|---|---|
| *H01L 21/324* | (2006.01) |
| *G01J 5/34* | (2022.01) |
| *G05B 13/02* | (2006.01) |
| *G05D 23/19* | (2006.01) |
| *G05D 23/27* | (2006.01) |
| *G06N 20/00* | (2019.01) |
| *H01L 21/66* | (2006.01) |
| *H05B 1/02* | (2006.01) |
| *F27B 17/00* | (2006.01) |
| *H05B 3/00* | (2006.01) |

(52) U.S. Cl.
CPC ........... *G05D 23/1917* (2013.01); *G01J 5/34* (2013.01); *G05B 13/0265* (2013.01); *G05D 23/27* (2013.01); *G06N 20/00* (2019.01); *H01L 22/12* (2013.01); *H05B 1/0233* (2013.01); *F27B 17/0025* (2013.01); *H05B 3/0047* (2013.01)

(58) Field of Classification Search
CPC ......... H01L 21/00; H01L 22/12; H01L 22/10; H01L 21/324; H01L 21/67115; H01L 21/02104; H01L 21/02; H01L 21/02002; G05D 23/1917; G05D 23/27; H05B 1/0233; H05B 3/0047; G01J 5/34
See application file for complete search history.

(56) References Cited

U.S. PATENT DOCUMENTS

| | | | |
|---|---|---|---|
| 7,112,763 | B2 | 9/2006 | Hunter et al. |
| 10,072,986 | B1 | 9/2018 | Howells |
| 10,281,335 | B2 | 5/2019 | Howells |
| 10,845,249 | B2 | 11/2020 | Howells |
| 2007/0020784 | A1 | 1/2007 | Timans |
| 2009/0255921 | A1 | 10/2009 | Ranish et al. |
| 2013/0280824 | A1 | 10/2013 | Ranish et al. |

FOREIGN PATENT DOCUMENTS

| | | |
|---|---|---|
| CN | 101826534 B | 12/2014 |
| CN | 103890667 B | 2/2017 |
| JP | 2002299275 A | 10/2002 |
| WO | 2006047062 A2 | 5/2006 |
| WO | WO-2019186655 A1 * | 10/2019 |

OTHER PUBLICATIONS

International Search Report and Written Opinion dated Nov. 10, 2022 for Application No. PCT/US2022/037813.

* cited by examiner

*Primary Examiner* — Don K Wong
(74) *Attorney, Agent, or Firm* — Patterson + Sheridan, LLP

(57) ABSTRACT

Aspects of the present disclosure relation to systems, methods, and apparatus for correcting thermal processing of substrates. In one aspect, a corrective absorption factor curve having a plurality of corrective absorption factors is generated.

20 Claims, 5 Drawing Sheets

SYSTEMS, METHODS, AND APPARATUS FOR CORRECTING THERMAL PROCESSING OF SUBSTRATES

BACKGROUND

Field

Aspects of the present disclosure relation to systems, methods, and apparatus for correcting thermal processing of substrates. In one aspect, a corrective absorption factor curve having a plurality of corrective absorption factors is generated.

Description of the Related Art

Several processing hindrances can arise when thermally processing substrates. For example, heating substrates can take time, causing reduced throughput and increased costs and delays. As another example, heating of substrates can be non-uniform, causing substrate defects and processing delays. As another example, substrates should reach an opacity that is sufficient for the substrates to properly absorb heat during processing.

Variances across substrates can exacerbate the hindrances described above. For example, differences in doping can cause variances in the time it takes to heat different substrates.

Therefore, there is a need for improved systems, methods, and apparatus that facilitate correcting thermal processing of substrates having a variety of different classifications.

SUMMARY

Aspects of the present disclosure relation to systems, methods, and apparatus for correcting thermal processing of substrates. In one aspect, a corrective absorption factor curve having a plurality of corrective absorption factors is generated.

In one implementation, a system for processing substrates includes a chamber including an internal volume, a substrate support, a plurality of heat lamps, and one or more radiation detectors disposed on an opposing side of the substrate support relative to the plurality of heat lamps. The system includes a controller including instructions that, when executed, cause a plurality of operations to be conducted. The plurality of operations include heating a substrate across a plurality of temperatures using the plurality of heat lamps. The heating includes directing an incident radiation to a receiving surface of the substrate across a plurality of wavelengths for each temperature of the plurality of temperatures. The plurality of operations include detecting a plurality of transmitted radiation values transmitted from a transmitting surface of the substrate across the plurality of wavelengths for each temperature of the plurality of temperatures. The plurality of operations include determining a plurality of absorptive factors across the plurality of wavelengths for each temperature of the plurality of temperatures, determining a plurality of absorbed power values across the plurality of wavelengths for each temperature of the plurality of temperatures, and generating an absorbed power curve across the plurality of wavelengths for each temperature of the plurality of temperatures. The plurality of operations include generating a corrective absorption factor curve having a plurality of corrective absorption factors. The plurality of operations include identifying a classification of the substrate, and transforming the corrective absorption factor curve. The transforming includes comparing the corrective absorption factor curve with a stored corrective factor curve having a plurality of stored corrective factors, and merging the corrective absorption factor curve with the stored corrective factor curve to generate a transformed corrective factor curve.

In one implementation, a method of correcting thermal processing of substrates includes heating a substrate across a plurality of temperatures, the heating including directing an incident radiation to a receiving surface of the substrate across a plurality of wavelengths for each temperature of the plurality of temperatures. The method includes detecting a plurality of transmitted radiation values transmitted from a transmitting surface of the substrate across the plurality of wavelengths for each temperature of the plurality of temperatures. The method includes determining a plurality of absorptive factors across the plurality of wavelengths for each temperature of the plurality of temperatures, and generating a corrective absorption factor curve having a plurality of corrective absorption factors. The method includes transforming the corrective absorption factor curve. The transforming includes comparing the corrective absorption factor curve with a stored corrective factor curve comprising a plurality of stored corrective factors, and merging the corrective absorption factor curve with the stored corrective factor curve to generate a transformed corrective factor curve.

In one implementation, a non-transitory computer readable medium for correcting thermal processing of substrates includes instructions that, when executed, cause a plurality of operations to be conducted. The plurality of operations include heating a substrate across a plurality of temperatures, the heating including directing an incident radiation to a receiving surface of the substrate across a plurality of wavelengths for each temperature of the plurality of temperatures. The plurality of operations include detecting a plurality of transmitted radiation values transmitted from a transmitting surface of the substrate across the plurality of wavelengths for each temperature of the plurality of temperatures. The plurality of operations include determining a plurality of absorptive factors across the plurality of wavelengths for each temperature of the plurality of temperatures, and generating a corrective absorption factor curve having a plurality of corrective absorption factors. The plurality of operations include transforming the corrective absorption factor curve. The transforming includes comparing the corrective absorption factor curve with a stored corrective factor curve having a plurality of stored corrective factors, and merging the corrective absorption factor curve with the stored corrective factor curve to generate a transformed corrective factor curve.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure relation to systems, methods, and apparatus for correcting thermal processing of substrates. In one aspect, a corrective absorption factor curve having a plurality of corrective absorption factors is generated. The corrective absorption factor curve is used to determine a corrected radiation power by dividing a selected radiation power by a corrective absorption factor disposed along the corrective absorption factor curve at a selected processing temperature. The selected radiation power corresponds to the selected processing temperature. The corrected radiation power is used to heat a classification of substrates during thermal processing.

Figure 1A:
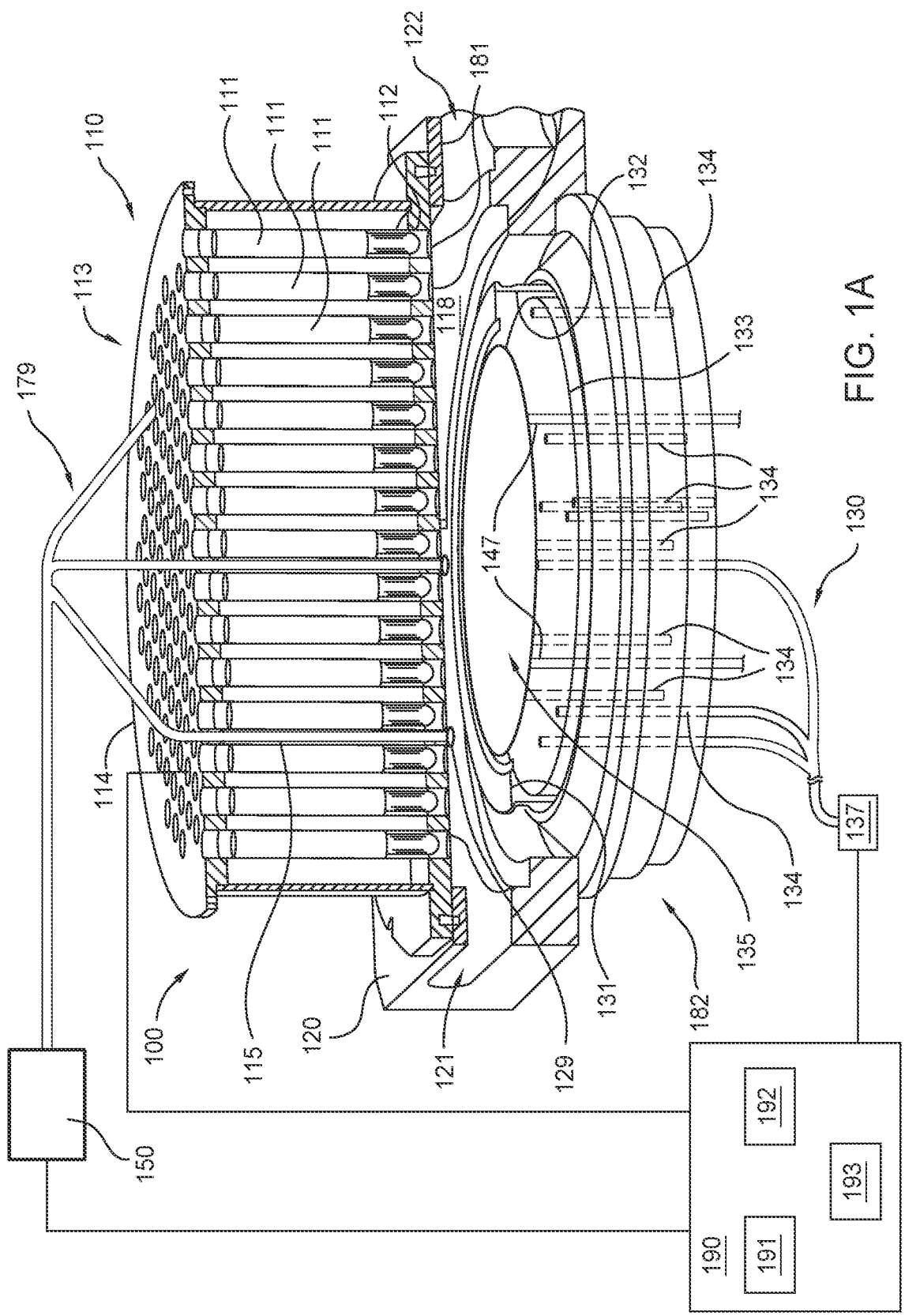
FIG. 1A is a partial schematic perspective view of a chamber, according to one implementation.

FIG. 1A is a partial schematic perspective view of a chamber 100, according to one implementation. The chamber 100 is part of a system for thermally processing substrates. The chamber 100 can be a rapid thermal processing (RTP) chamber. The chamber 100 can be configured to conduct continuous spectra transmission pyrometry ("CSTP") that measures spectra of radiation transmitted through a substrate (e.g., a silicon substrate) at a range of wavelengths (e.g., more than one or two primary wavelengths) to infer the temperature of the substrate.

The chamber 100 includes a lamp assembly 110, a chamber body 120 and a substrate support 182. In the implementation shown in FIG. 1A, the substrate support 182 is an assembly. For clarity, the chamber 100 has been cross-sectioned, and only the upper portion of chamber body 120 is illustrated in FIG. 1A. The lamp assembly 110 includes a plurality of heat lamps 111, each of which is positioned inside a respective reflective tube 112. The heat lamps 111 can be incandescent lamps, such as tungsten-halogen, or other high output lamps, such as discharge lamps. The reflective tubes 112 are arranged in a honeycomb array 113 inside a water-cooled housing 114. A thin window 115 forms a bottom surface of the lamp assembly 110, separating the lamp assembly 110 from a vacuum environment often present in an internal volume 118 of the chamber 100. Quartz can be used for the window 181 since quartz is transparent to infrared light. The lamp assembly 110 is attached to an upper surface of the chamber body 220 in a vacuum-tight manner.

The chamber body 120 includes walls and a floor of the chamber 100 as well as a substrate opening 121 and an exhaust opening 122. Substrates are delivered into and removed from the internal volume 118 of the chamber 100 through the substrate opening 311. A vacuum pump (not shown) exhausts gases from the chamber 100 through the exhaust opening 122. Slit or gate valves (not shown) may be used to seal the substrate opening 121 and the exhaust opening 122.

The substrate support 182 is disposed within the chamber body 120 and in the internal volume 118. The substrate support 182 includes an edge ring 131, a rotatable quartz cylinder 132, a reflector plate 133, and an array of photo probes 134 (e.g., optical fibers). The edge ring 131 rests on the rotatable quartz cylinder 132. The rotatable quartz cylinder 132 may optionally rotate during substrate processing to facilitate maximizing substrate temperature uniformity during thermal processing by facilitating minimizing the effect of thermal asymmetries in the chamber 100 on the substrate. A reflector plate 133 can be positioned about 5 mm beneath the substrate. Photo probes 134 extend through the reflector plate 133 and are directed at the bottom of the substrate during thermal processing. The photo probes 134 transmit radiant energy from the substrate to one or more radiation detectors (e.g., radiation detector 137) for determining substrate temperature, substrate absorptive factor(s), substrate frontside emissivity, and/or reflectivity during thermal processing. The radiation detector 137 can be a transmission pyrometer. The radiation detectors measure broadband emissions from the backside of the substrate in a selected range of wavelengths (e.g., between wavelengths of about 200 nm to about 5000 nm). The photo probes 134 are disposed within the chamber 100 and in the internal volume 118.

The radiation detector 137 can include a filter that may provide a spectral response sensitive to the wavelength of the absorption gap at the substrate temperatures between about 100° C. and about 600° C., such as about 400° C. In one embodiment, which can be combined with other embodiments, the radiation detector 137 includes a photodetector. The photodetector can be a silicon (Si) photodetector, a germanium (Ge) photodetector, a lead sulfide (PbS) photodetector, an indium arsenide (InAs) photodetector, an indium gallium arsenide (InGaAs) photodetector, and/or an indium antimonide (InSb) photodetector. In one example, which can be combined with other examples, the photodetector is a silicon photodiode or an InGaAs photodiode. The filter can be disposed between the photodetector and the beam splitter. The present disclosure contemplates that the filter and/or the beam splitter can be omitted. The silicon photodiode can have a wavelength detection band within a range of about 0.4 microns to about 1.1 microns. The InGaAs photodiode can have a wavelength detection band within a range of about 0.8 microns (such as 0.9 microns) to about 1.8 microns (such as 1.7 microns).

The chamber 100 can include a low-divergence, continuum radiation source that generates a wide spectrum of mid-infrared radiation (e.g., including wavelengths from about 1000 nm to about 1700 nm). The continuum radiation source may emit, or include optics to produce, highly collimated radiation. The collimated radiation may be transmitted through a beam guide (e.g., a single mode optical fiber, a multi-mode optical fiber, etc.) onto the substrate disposed in the internal volume 118. The substrate is a transparent substrate or a semitransparent substrate that is formed of one or more of silicon, carbon, germanium, phosphorus, polysilicon, oxide, nitride, metal film, and/or boron. In one embodiment, which can be combined with other embodiments, the substrate is a silicon substrate. The metal film of the substrate includes one or more of titanium, titanium nitride (TiN), cobalt, nickel, tungsten, copper, manganese, and/or other suitable metal(s).

A portion of the collimated radiation may transmit through the substrate. The amplitude of the transmitted radiation may be a function of a temperature of the substrate and of the wavelength of the incident radiation. A photo probe 134 (e.g., a light pipe) may be aligned to receive the transmitted radiation. For example, the photo probe 134 may be aligned with the beam guide.

The photo probe 134 may direct the transmitted radiation (transmitted from the transmitting surface of the substrate) to one or more spectrometers. For example, the photo probe 134 may direct the transmitted radiation to a diffraction grating. The diffraction grating may separate the transmitted radiation in different directions as a function of wavelength. A collimating lens may focus the diffracted radiation to one or more focus points. One or more photodetectors may then measure the radiation as a function of direction, which thereby is a function of wavelength. For example, an indium gallium arsenide linear array may be positioned at the back focal plane of the collimating lens to measure power as a function of wavelength. The power spectrum (as a function of wavelength) of the transmitted radiation may be compared to the power spectrum of the incident radiation. The incident radiation is the source radiation that is incident on the substrate.

The two power spectra may be used to calculate the transmission of the substrate as a function of wavelength. The transmission of the substrate can be used to determine an absorptive factor of the substrate. The transmission can also be used to infer a temperature of the substrate. In some embodiments, zones of the substrate may be identified, and CSTP may be done on each zone to create a temperature map of the substrate. In one embodiment, which can be combined with other embodiments, longer wavelengths (e.g., greater than 1080 nm) of source radiation may be utilized.

As shown in FIG. 1A, the substrate support 182 may define a processing area 135, proximate which, during operations, the substrate can be disposed. As illustrated, a continuum radiation source 150 is disposed outside of the chamber 100. The continuum radiation source 150 can be disposed inside of the lamp assembly 110, attached to the lamp assembly 110, immediately outside of the lamp assembly 110, or otherwise located to suit operational specifications.

The continuum radiation source 150 is configured to generate source radiation for input to source manifold 179. The continuum radiation source 150 may be a quantum emission source, such as a continuum laser or an appropriately phosphor coated light emitting diode ("LED"), or a high powered halogen source. The source radiation travels through the source manifold 179 and ultimately reaches an incident area of a receiving surface of the substrate (e.g., proximate the processing area 335) as incident radiation. In one example, which can be combined with other examples, the source manifold 179 includes a plurality of beam guides 115 interspersed with the reflective tubes 112. A collimating lens 129 can be located at ends of the beam guides 115 (e.g., the ends closest to the processing area 135). The collimating lens 129 can direct the source radiation onto an incident area of the receiving surface of the substrate. A portion of the source radiation directed from each beam guide 115 may be transmitted from the receiving surface of the substrate to the opposite, transmitting surface of the substrate. For example, the source radiation may be incident on the receiving surface of the substrate at the incident area, and the transmitted radiation may exit the transmitting surface of the substrate at the emanating area.

The plurality of photo probes 134 can be arranged with an end of each photo probe 134 proximate the transmitting surface of the substrate. For example, each photo probe 134 can be aligned with a respective beam guide 115 to detect the transmitted radiation transmitted from the transmitting surface of the substrate. In one embodiment, which can be combined with other embodiments, each beam guide 115 of the source manifold 110 has an aligned photo probe 134. The present disclosure contemplates that there can be more beam guides 115 than photo probes 134. The present disclosure contemplates that there can be more photo probes 134 than beam guides 115. The collection of photo probes 134 can make up the detector manifold 130. The transmitted radiation may travel through the detector manifold 130 and ultimately reach one or more radiation detectors 137. In one embodiment, which can be combined with other embodiments, a single radiation detector 137 can receive transmitted radiation from all of the photo probes 134. The present disclosure contemplates that multiple radiation detectors 137 can be used. In one embodiment, which can be combined with other embodiments, the detector manifold 130 connects a subset of the photo probes 134 with each radiation detector 137. In one embodiment, which can be combined with other embodiments, the detector manifold 130 connects a single photo probe 134 with each radiation detector 137. The detector manifold 130 can use optical splitters to deliver transmitted radiation from one photo probe 134 to multiple radiation detectors 137. The detector manifold 130 can use optical combiners to deliver transmitted radiation from multiple photo probes 134 to a single radiation detector 137.

The continuum radiation source 150 may be configured so that source radiation may be selected over and/or distinguished from background radiation. For example, the continuum radiation source 150 may be a bright source so that any background radiation is negligible in comparison. As another example, continuum radiation source 150 may be turned off periodically to sample the background radiation for calibration and/or normalization. The continuum radiation source 150 may be a high-power radiant source, for example a quantum sources such as a laser and/or LED. In one embodiment, which can be combined with other embodiments, the continuum radiation source 150 emits source radiation in wavelengths selected to match, or otherwise complement, the spectral characteristics of the radiation detector 137. In one embodiment, which can be combined with other embodiments, the continuum radiation source 150 is a directed radiation source, for example a collimated or partially collimated source, to direct radiation through the substrate to be received by the radiation detector 137. Collimation may be selected to match the radiation to the numerical aperture of the radiation detector 137. Collimation may improve the signal-to-noise ratio of the system.

The source manifold 179 and/or the beam guides 115 may be configured to direct source radiation to a plurality of locations proximate processing area 135 simultaneously or sequentially. The detector manifold 130 and/or photo probes 134 may be configured to receive transmitted radiation from a plurality of locations proximate processing area 135 simultaneously or sequentially.

The radiation detector 137 may measure the transmitted radiation (transmitted from the substrate) as a function of wavelength. The power spectrum (as a function of wavelength) of the transmitted radiation may be compared to the power spectrum of the incident radiation. For example the power spectrum of the incident radiation may be obtained directly and/or simultaneously. In one embodiment, which can be combined with other embodiments, a portion of the source manifold 179 is coupled to a portion of the detector manifold 130 to provide direct measurement of the source power spectrum. The measurement of the source power spectrum can be done simultaneously with, or at about the same time as, measurements of the power spectrum of the transmitted radiation.

During a method of correcting thermal processing of substrates, source radiation is directed to the substrate from the heat lamps 111 and/or the continuum radiation source 150. The substrate disposed in the internal volume 118 includes a receiving surface facing the heat lamps 111 and a transmitting surface facing the reflector plate 133. Incident radiation of the source radiation is received by the substrate, transmitted through the substrate, and transmitted to the photo probes 134 from the substrate. The two power spectra (the spectra of the incident radiation and the spectra of the transmitted radiation) may be used to calculate the transmission of the substrate as a function of wavelength. The transmission of transmitted radiation through and from the substrate is used to determine an absorptive factor of the substrate. The calculated transmission be used to infer temperature of the substrate.

A redundancy of measurement signals may be created. Redundant measurement signals may be created by comparing the power spectrum of the transmitted radiation to the power spectrum of the incident radiation. More redundant signals may allow for more accurate measurements of substrate temperature, substrate absorptive factor(s), substrate reflectivity, and/or substrate emissivity. Determining the absorptive factor of the substrate and/or inference of temperature from the measured power spectrum of transmitted light may be aided by calibrating the radiation detector 137 to a known standard. The substrate can be heated to a known temperature, and a power spectrum of the transmitted radiation at that known temperature can be determined and stored. A calibration curve can be constructed by storing the power spectrum at a plurality of known temperatures. The calibration curve can then be used to determine an absorptive factor and/or a temperature of subsequent substrates having the same, or suitably similar, transmission responses. Using stored values (such as the stored transmitted radiation value and/or the absorptive factor value), one or more classification(s) of subsequent substrates can be identified. One or more classifications of substrates can be identified by comparing absorbed radiation of a substrate to a known signal versus doping level curve (such as the graph 800). The identification of the one or more classifications can account for a photo sensitivity range across wavelengths for the photodetector used to detect emissivity for determining the absorbed radiation. The classification(s) can indicate a degree of doping of the subsequent substrates. Equilibrium and non-equilibrium readings may be calibrated by controlling the conditions of the equilibrium or non-equilibrium state and relating such conditions to the measured power spectrum.

The system having the chamber 100 includes a controller a controller 190 coupled to the chamber 100. The controller 190 includes a central processing unit (CPU) 191, a memory 192 containing instructions, and support circuits 193 for the CPU 191. The controller 190 controls the continuum radiation source 150, the radiation detector 137, and/or the heat lamps 111 directly, or via other computers and/or controllers. The controller 190 is of any form of a general-purpose computer processor that is used in an industrial setting for controlling various chambers and equipment, and sub-processors thereon or therein.

The memory 192, or non-transitory computer readable medium, is one or more of a readily available memory such as random access memory (RAM), read only memory (ROM), floppy disk, hard disk, flash drive, or any other form of digital storage, local or remote. The support circuits 193 are coupled to the CPU 191 for supporting the CPU 191 (a processor). The support circuits 193 include cache, power supplies, clock circuits, input/output circuitry and subsystems, and the like. Substrate processing parameters (such as a processing temperature—for example an anneal temperature, substrate doping, substrate transmissivity, substrate frontside emissivity, substrate absorptivity, substrate thickness, and/or substrate reflectivity) and operations are stored in the memory 192 as a software routine that is executed or invoked to turn the controller 190 into a specific purpose controller to control the operations of the system 101, such as the gas circuit 180 and the chamber 100. The substrate processing parameters can be known or can be measured during thermal processing. The controller 190 is configured to conduct any of the methods described herein. The instructions stored on the memory 192, when executed, cause one or more of operations 203-217 of method 200 to be conducted.

The various operations described herein (such as the operations 203-217 of the method 200) can be conducted automatically using the controller 190. The controller 190 can be configured to conduct the method 200 for each substrate thermally processed in the chamber 100.

The controller 190 can output and display on a display (such as a user interface) in the form of a graph and/or a table one or more aspects described in relation to the method 200. For example, the controller 190 can display on the display a graph similar to one of the graphs 300-700 described below.

The instructions stored in the memory 192 of the controller 190 can include one or more machine learning/ artificial intelligence algorithms (such as the regression machine learning model described below) that can be executed in addition to the operations described herein. As an example, a machine learning/artificial intelligence algorithm executed by the controller 190 can consider, weigh, update, and store substrate processing parameters (such as a processing temperature—for example an anneal temperature, substrate doping, substrate transmissivity, substrate frontside emissivity, substrate absorptivity, substrate thickness, and/or substrate reflectivity) for different classifications of substrates thermally processed in the chamber 100. As another example, the machine learning/artificial intelligence algorithm executed by the controller 190 can continuously generate and transform a corrective absorption factor curve for substrates thermally processed in the chamber 100. As another example, the machine learning/artificial intelligence algorithm executed by the controller 190 can monitor opacity of the substrates to determine an upper end to use for the plurality of temperatures.

Figure 1B:
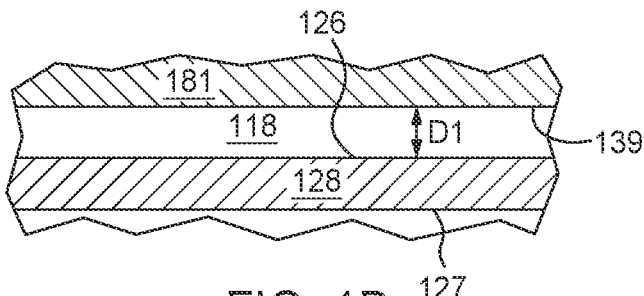
FIG. 1B is a partial schematic view of a substrate disposed in the internal volume of the chamber shown in FIG. 1A, according to one implementation.

FIG. 1B is a partial schematic view of a substrate 128 disposed in the internal volume 118 of the chamber 100 shown in FIG. 1A, according to one implementation. The substrate 128 is shown in a raised processing position in FIG. 1B where the substrate 128 is raised above the edge ring 131 using lift pins 147 (two are shown in FIG. 1A), such that the substrate is disposed at a gap from the edge ring 131. The present disclosure contemplates that three or more lift pins 147 can be used to raise and lower the substrate 128. The substrate 128 can be lowered (using the lift pins 147) to be supported on the edge ring in a lowered processing position. A temperature of the substrate can be measured at the lowered processing position, and operations of the method 200 can be conducted at the raised processing position. The substrate 128 includes a receiving surface 126 and a transmitting surface 127. The thermal processing and the method 200 described below are conducted while the substrate 128 is in the raised processing position. In the raised processing position shown in FIG. 1B, the substrate 128 is positioned at a distance D1 relative to an upper surface 139 of the internal volume 118 during the conducting of the method 200 described below. The distance D1 is 1 mm or less. In one embodiment, which can be combined with other embodiments, the distance D1 is within a range of 0.1 mm to 1 mm. In the implementation shown in FIG. 1B, the upper surface 139 is a lower surface of the window 181. In the lowered processing position of the substrate 128, the distance D1 is increased, such as to about 24 mm.

The distance D1 facilitates directing source radiation toward the substrate 128 as incident radiation rather than around the substrate 128. The distance D1 also facilitates reducing heating of the edge ring 131 during powering of the heat lamps 111. The distance D1 facilitates quickly, efficiently, and uniformly heating the substrate 128 to an anneal temperature and accurately correcting thermal processing.

Figure 2:
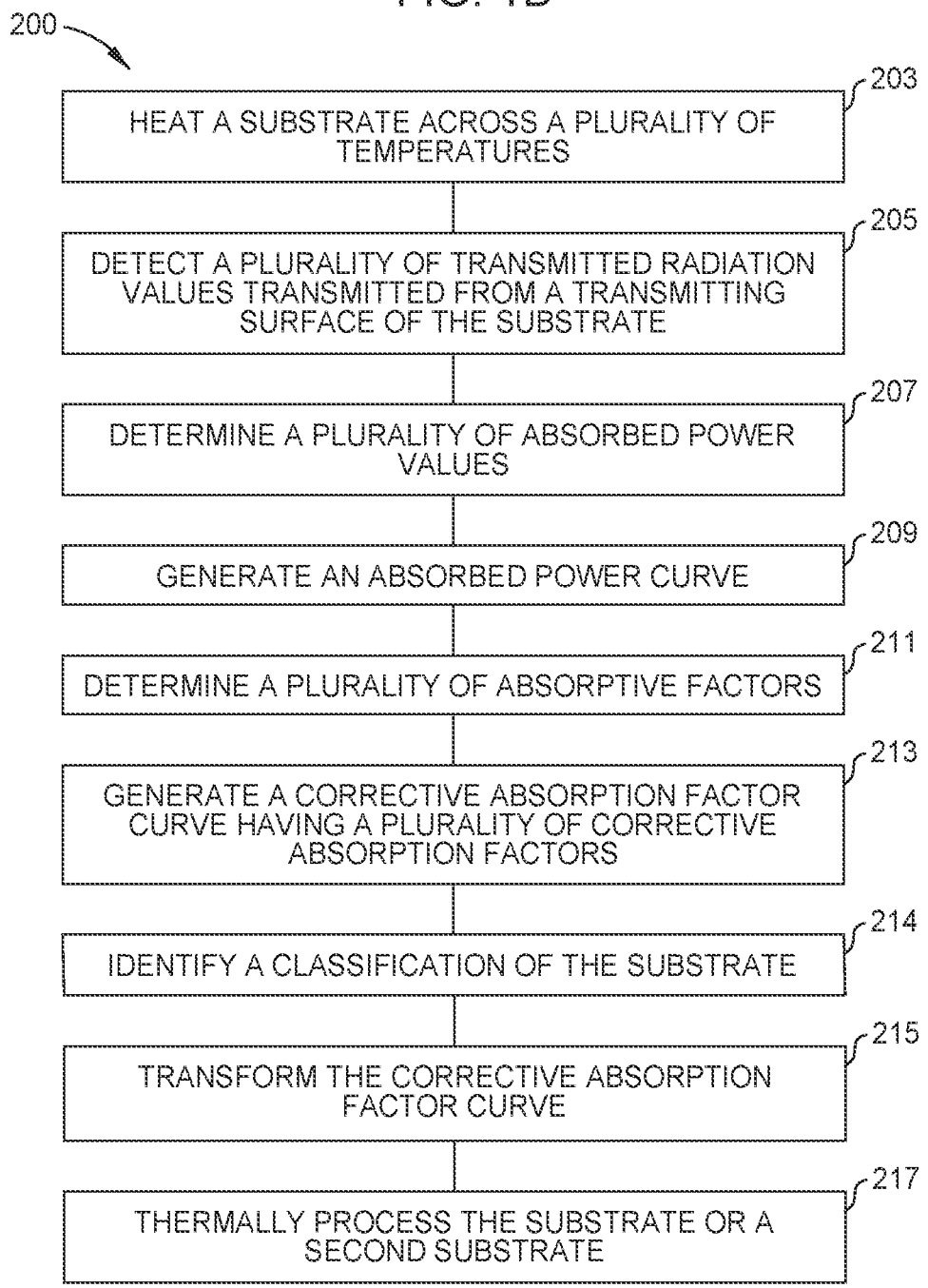
FIG. 2 is a schematic graphical view of a method of correcting thermal processing of substrates, according to one implementation.

FIG. 2 is a schematic graphical view of a method 200 of correcting thermal processing of substrates, according to one implementation. Operation 203 includes heating a substrate across a plurality of temperatures. An upper end of the plurality of temperatures is an opacity temperature for the substrate. The heating includes directing an incident radiation to a receiving surface of the substrate across a plurality of wavelengths for each temperature of the plurality of temperatures. The incident radiation is directed to the substrate using a plurality of heat lamps and/or a radiation source (such as a continuum radiation source) used in addition to the heat lamps. Each temperature of the plurality of temperatures is known, or is measured using one or more pyrometers. Operation 205 includes detecting a plurality of transmitted radiation values transmitted (e.g., emitted) from a transmitting surface of the substrate. The plurality of transmitted radiation values are detected across the plurality of wavelengths for each temperature of the plurality of temperatures. Using the transmitted radiation values, a plurality of absorptive radiation values are determined across the plurality of wavelengths for each temperature of the plurality of temperatures as absorptivity is equal to emissivity.

Operation 207 includes determining a plurality of absorbed power values across the plurality of wavelengths for each temperature of the plurality of temperatures.

Operation 209 includes generating an absorbed power curve across the plurality of wavelengths for each temperature of the plurality of temperatures.

Operation 211 includes determining a plurality of absorptive factors across the plurality of wavelengths for each temperature of the plurality of temperatures.

Operation 213 includes generating a corrective absorption factor curve having a plurality of corrective absorption factors. The generating the corrective absorption factor curve includes determining an absorbed integral of the absorbed power curve (of operation 209) for each temperature of the plurality of temperatures, and determining an emitted integral of an incident radiation curve of the incident radiation that is incident on the substrate. The generating the corrective absorption factor curve includes dividing the absorbed integral by the emitted integral for each temperature of the plurality of temperatures to determine the plurality of corrective absorption factors, and plotting the plurality of corrective absorption factors as part of the corrective absorption factor curve.

The corrective absorption factor curve is defined by a polynomial function (such as a quadratic function) that connects the plurality of corrective absorption factors. Smooth curve fitting may be used to connect the plurality of corrective absorption factors and generate the corrective absorption factor curve. A regression machine learning model may be used to connect the plurality of corrective absorption factors and generate the corrective absorption factor curve.

Operation 214 includes identifying a classification of the substrate. The transmitted radiation values (which can be referred to as the absorptive radiation values since emissivity equals absorptivity), the absorbed power values, the absorbed power curve, the absorptive factors, and/or the corrective absorption factors can be used to identify the classification of the substrate. As an example, the substrate can be identified if there is no known data that can be used to identify the classification of the substrate. In one embodiment, which can be combined with other embodiments, a graph (such as the graph 800 shown in FIG. 8) of detected signal versus doping level for a photodetector is used to identify a doping level of the substrate. The substrate is heated while the photodetector (the same one used to create the graph) measures a transmission signal. The transmission signal is compared to the graph (such as the graph 800 shown in FIG. 8) of detected signal versus doping level to determine the doping level of the substrate. Using the identified doping level, one or more of the graphs 400-700 can be identified for the substrate, such as by retrieving the graphs 400-700 that are stored in a memory as stored graphs. The graphs 400-700 can be predicted for the substrate, and the graphs 400-700 can be used to thermally process the substrate. The graphs 400-700 can be merged with graphs determined in one or more iterations of the method 200 being conducted.

As described, the identified classification of the substrate can indicate a degree of doping of the substrate. A higher absorption of radiation can indicate a higher degree of doping of the substrate as substrates with high doping levels can absorb more radiation and at a higher rate than substrates with lesser doping levels. In one embodiment, which can be combined with other embodiments, lower transmitted radiation values and/or higher corrective absorption factors indicate a higher degree of doping. In one embodiment, which can be combined with other embodiments, an increase in radiation absorption indicates a substrate having a doping level of 1E18 or more.

Operation 214 can be conducted at least partially simultaneously with the operations of operations 203-213, 215, and/or 217. In one embodiment, which can be combined with other embodiments, the identifying the classification of the substrate of operation 214 involves conducting portions of the operations 203-213 for a single temperature, such as the single temperature of 20 degrees Celsius. In such an embodiment, data (such as the transmitted radiation values) of operations 203-213 for other temperatures of the plurality of temperatures (such as 400 degrees Celsius) is predicted and/or retrieved from a memory using the classification identified in operation 214.

Operation 215 includes transforming the corrective absorption factor curve. The transforming includes comparing the corrective absorption factor curve with a stored corrective factor curve having a plurality of stored corrective factors. The stored corrective factor curve and/or the plurality of stored corrective factors can be at least part of the data that is predicted and/or retrieved from the memory using the classification identified in operation 214. The transforming the corrective absorption factor curve includes, for each corrective absorption factor of the plurality of corrective absorption factors: determining a ratio of the corrective absorption factor relative to the stored corrective factor curve at the same temperature. The transforming the corrective absorption factor curve includes, for each corrective absorption factor of the plurality of corrective absorption factors: ignoring the respective corrective absorption factor if the ratio is outside of a first acceptance range or within a second acceptance range that is narrower than the first acceptance range. The first acceptance range is 0.7 to 1.3, and the second acceptance range is 0.995 to 1.005. The respective corrective absorption factor is accepted if the ratio is within the first acceptance range and outside of the second acceptance range. Other first and second acceptance ranges are contemplated. The first and second acceptance ranges can be set by a user and/or can be determined, for example by the machine learning model. The first and second acceptance ranges can be determined by conducting historical deviation operations on existing ratio data from previous iterations of the calibration operation.

If the respective corrective absorption factor is ignored, the respective corrective absorption factor is omitted from the corrective absorption factor curve. The transforming includes merging the corrective absorption factor curve with the stored corrective factor curve to generate a transformed corrective factor curve. The merging of the corrective absorption factor curve with the stored corrective factor curve includes executing a machine learning model to generate the transformed corrective factor curve. The machine learning model is a regression model and a classification model. Conducting the machine learning model involves determining a classification (which can have stored data) and conducting a regression in the classification (which can include conducting a regression using new data in relation to the stored data). The machine learning model can include data preprocessing, input channels for context information (for the classification determination), and training set definition, for example. The machine learning model can be conducted continuously with each new data set available, or conducted during a dedicated training period. In one embodiment, which can be combined with other embodiments, the merging includes weighing and averaging the plurality of corrective absorption factors and the plurality of stored corrective factors.

The weighing and averaging the plurality of corrective absorption factors and the plurality of stored corrective factors involves assigning a weight to the plurality of corrective absorption factors and the plurality of stored corrective factors prior to conducting the averaging. The assigned weights can take into account the durational age of the plurality of stored corrective factors and the ratio described above.

The transformed corrective factor curve is tailored to the substrate (and other substrates in the same classification) and can be stored and used for thermal processing of other substrates in the same classification.

Operations 203-215 can be conducted while the substrate is in the raised processing position, prior to lowering the substrate to the lowered processing position. Operations 203-215 can involve heating the substrate from a room temperature to a raised temperature (such as 300 degrees Celsius) that corresponds to a temperature of the edge ring that is reached because of processing of prior substrates. Heating the substrate to the raised temperature facilitates reducing operation failures, reducing processing inefficiencies, and reducing substrate defects. Operation 217 includes thermally processing the substrate or a second substrate. The thermally processing of the substrate or a second substrate includes selecting a processing temperature and a radiation power corresponding to the processing temperature. The thermally processing of the second substrate includes determining a corrected radiation power by dividing the radiation power by a corrective absorption factor disposed along the corrective absorption factor curve at the processing temperature. The corrected radiation power has a wavelength that is less than 1 micron and a power that is 0.02 W/cm$^2$-nm or more, such as 0.04 W/cm$^2$-nm or more. Operation 217 of the method 200 can involve correcting source radiation (and correcting incident radiation) emitted by the one or more lamps during the thermal processing, such as by altering the wavelength of radiation emitted by the lamps and/or altering the lamp voltage applied to the one or more lamps. The correcting of the source radiation (and incident radiation) can facilitate achieving a target ramp rate for heating the substrate that is substantially uniform (e.g., constant) and quick. In one embodiment, which can be combined with other embodiments, the wavelength is shifted downward and/or the lamp voltage is increased. The target ramp rate can heat the substrate to be at the same temperature as the edge ring (such as within a range of 400 degrees Celsius to 600 degrees Celsius) resulting from prior processing.

The temperature ramp rate (for each of the substrate and the edge ring) is dependent on the temperature of the substrate or the edge ring, time, the substrate doping level, the absorptivity of the substrate or the edge ring, the lamp voltage, and the reflectivity of the substrate or the edge ring. The temperature ramp rate can be determined for each of the substrate and the edge ring, and compared such that the temperature of the substrate is heated to the temperature of the edge ring within a target time.

The thermal processing of operation 217 can involve heating the substrate or the second substrate to a target temperature (such as a temperature of the edge ring) while in the raised processing position, and lowering the substrate (or the second substrate) to the edge ring (the lowered processing position) for additional thermal processing of the substrate or second substrate while rotating the substrate or second substrate on the edge ring.

The correcting of the source radiation to achieve the target ramp rate can be conducted using the machine learning model.

The thermally processing of the second substrate includes heating the second substrate to the processing temperature by emitting the corrected radiation power from the plurality of heat lamps. The processing temperature is within a range of 100° C. to 600° C., such as 300° C. to 600° C. In one embodiment, which can be combined with other embodiments, the processing temperature is 400° C. The second substrate is heated from an ambient temperature (such as a room temperature) to the processing temperature in a time period that is 25 seconds or less.

The present disclosure contemplates that operations 203-215 can be conducted in relation to the second substrate before, during, or after operation 217. The present disclosure contemplates that operations 203-217 can be continuously conducted in relation to a plurality of substrates (such as 1,000 substrates). In one embodiment, which can be combined with other embodiments, the corrective absorption factor curve can be generated and transformed using the machine learning model for each of the plurality of substrates. The transformed corrective factor curve can be stored as the stored corrective factor curve for merging with a subsequent corrective absorption factor curve.

The present disclosure contemplates that one or more operations 203-215 of the method 200 can be omitted during an iteration of the method 200. In one embodiment, which can be combined with other embodiments, operations 203-211 are omitted, certain aspects are known and/or stored (such as the absorbed power values, the absorbed power curve, and the plurality of absorptive factors), and operations 213-217 are conducted during an iteration of the method 200. In one embodiment, which can be combined with other embodiments, operations 203-213 are omitted, certain aspects are known and/or stored (such as the corrective absorption factor curve and the plurality of corrective absorption factors), and operations 215, 217 are conducted during an iteration of the method 200.

Figure 3:
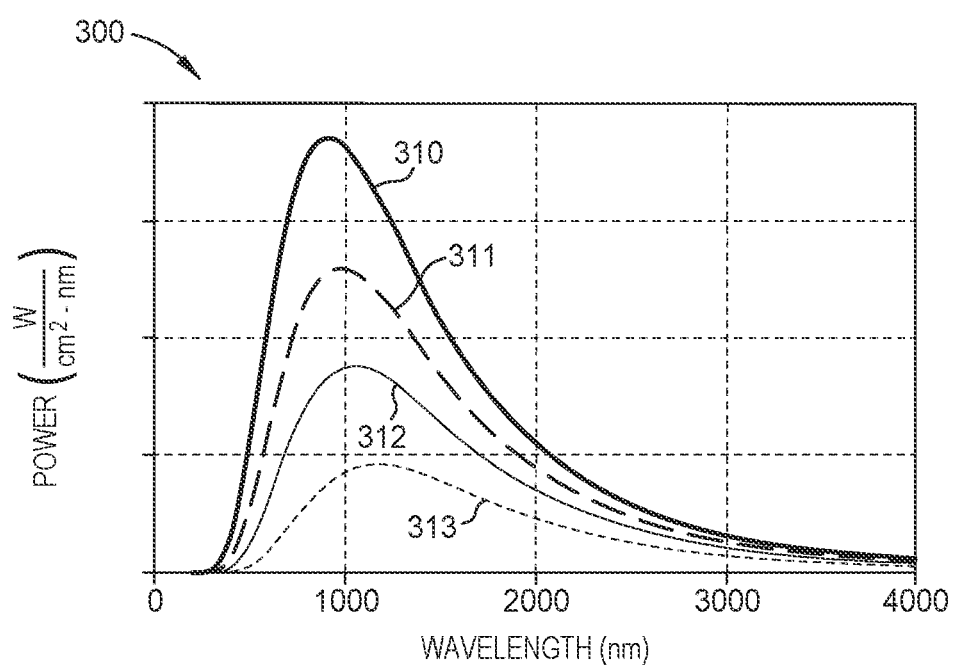
FIG. 3 is a schematic graphical view of a graph showing power versus wavelength for a radiation source, according to one implementation.

FIG. 3 is a schematic graphical view of a graph 300 showing power versus wavelength for a radiation source, according to one implementation. The graph 300 includes a plurality of incident radiation curves 310-313 for one or more radiation sources, which are one or more heat lamps. Each incident radiation curve 310-313 corresponds to a different lamp voltage that is applied to power the one or more heat lamps. As an example, each incident radiation curve 310-313 can correspond to a percentage of a maximum voltage. The vertical axis of the graph 300 plots an emitted power (in $W/(cm^2\text{-nm})$) of the incident radiation emitted by the one or more radiation sources, and the horizontal axis of the graph 300 plots a wavelength (in nm) of the incident radiation emitted by the one or more radiation sources.

Figure 4:
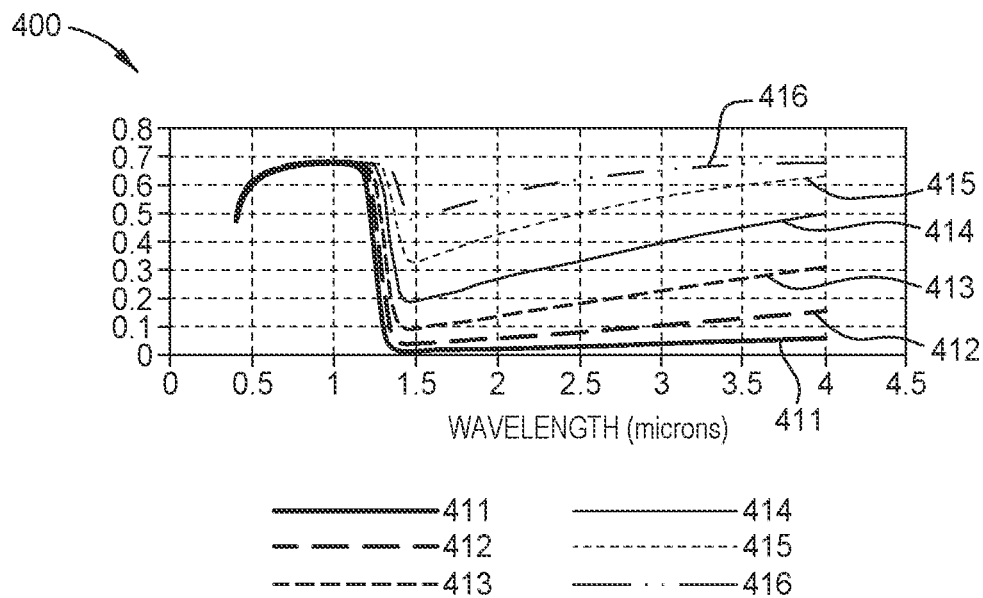
FIG. 4 is a schematic graphical view of a graph showing transmitted radiation versus wavelength, according to one implementation.

FIG. 4 is a schematic graphical view of a graph 400 showing absorptive radiation versus wavelength, according to one implementation. The graph 400 includes a plurality of lines 411-416. Each line of the lines 411-416 corresponds to a temperature of a plurality of temperatures. The temperature is a temperature to which the substrate is heated. The vertical axis of the graph 400 plots absorptive radiation values (in percentage relative to the a blackbody having an emissivity of 1.0, which can be referred to as a absorptivity or emissivity coefficient) emitted from the transmitting surface of a substrate and detected by one or more radiation detectors. The horizontal axis of the graph 400 plots a wavelength (in nm) of the absorptive radiation that is detected by the one or more radiation detectors.

Each of the lines 411-416 show the plurality of absorptive radiation values across the plurality of wavelengths for each respective temperature. In the graph 400, line 411 corresponds to 350° C., line 412 corresponds to 400° C., line 413 corresponds to 450° C., line 414 corresponds to 500° C., line 415 corresponds to 550° C., and line 416 corresponds to 600° C. The present disclosure contemplates that lines corresponding to 20° C., 50° C., 100° C., 150° C., 200° C., 250° C., 300° C., 650° C., 700° C., and/or 750° C. can also be plotted in the graph 400.

Figure 5:
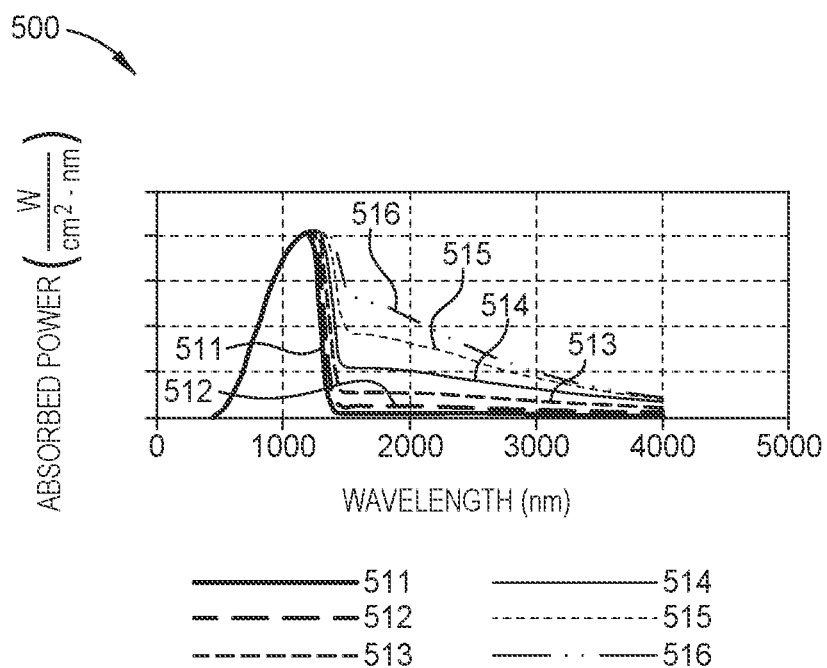
FIG. 5 is a schematic graphical view of a graph showing absorbed power versus wavelength, according to one implementation.

FIG. 5 is a schematic graphical view of a graph 500 showing absorbed power versus wavelength, according to one implementation. The graph 500 includes a plurality of lines 511-516. Each line of the lines 511-516 is an absorbed power curve having a plurality of absorbed power values.

Each line of the lines 511-516 corresponds to a temperature of a plurality of temperatures. The temperature is a temperature to which the substrate is heated. The vertical axis of the graph 500 plots the absorbed power value for the substrate (in $W/(cm^2\text{-nm})$). The horizontal axis of the graph 500 plots a wavelength (in nm) of the absorptive radiation. Each of the absorbed power values is determined by integrating the emitted power of the graph 300 with the emissivity of the substrate shown in the graph 400 at the same wavelength and the same temperature.

The relationship of incident radiation I on a substrate is shown by the following algorithm:

$$I = A + T + R \quad \text{(Equation 1)}$$

where A is absorbed radiation that heats the substrate, T is transmitted radiation that is transmitted through the substrate and detected by one or more radiation detectors, and R is reflected radiation that is reflected from the receiving surface 126. The reflected radiation R can be detected by one or more radiation detectors disposed on a lamp side of the substrate. The relationship of the transmitted radiation T for the substrate is shown by the following algorithm for optical radiation of a wavelength passing through the substrate:

$$T(\alpha, \chi) = e^{-\alpha \chi} \quad \text{(Equation 2)}$$

where $\alpha$ is the absorption coefficient and $\chi$ is a thickness of the substrate. The absorption coefficient $\alpha$ represents the absorbed radiation A divided by the incident radiation I onto the substrate which is emitted by the one or more heat lamps.

Using Equation 1, absorbed radiation A can be represented by the following algorithm:

$$A = I - T - R \quad \text{(Equation 3)}$$

Absorbed radiation A can be calculated as a function of wavelength $\lambda$ of the radiation, transmitted radiation T, and the material (which can include doping level) of the substrate. Reflected radiation R can be calculated as a function of wavelength $\lambda$ of the radiation, transmitted radiation T, and the material (which can include doping level) of the substrate. A first order of the reflected radiation R is constant, and can be assumed to be zero. In one embodiment, which can be combined with other embodiments, the absorbed radiation A can be presumed to be equal to a negative value of the transmitted radiation T, in according with the present disclosure.

Each of the lines 511-516 show the absorbed power values (the absorbed radiation A) across the plurality of wavelengths for each respective temperature. In the graph 500, line 511 corresponds to 350° C., line 512 corresponds to 400° C., line 513 corresponds to 450° C., line 514 corresponds to 500° C., line 515 corresponds to 550° C., and line 516 corresponds to 600° C. The present disclosure contemplates that lines corresponding to 20° C., 50° C., 100° C., 150° C., 200° C., 250° C., 300° C., 650° C., 700° C., and/or 750° C. can also be plotted in the graph 500.

Figure 6:
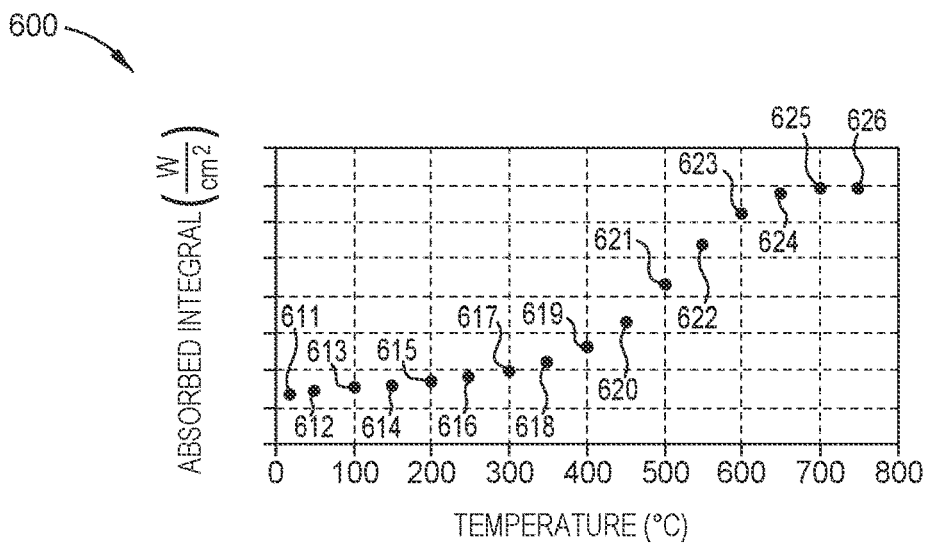
FIG. 6 is a schematic graphical view of a graph showing absorbed integral versus temperature, according to one implementation.

FIG. 6 is a schematic graphical view of a graph 600 showing absorbed integral versus temperature, according to one implementation. The graph 600 includes a plurality of absorbed integrals 611-626. Each absorbed integral 611-626 corresponds to a temperature of the plurality of temperatures. Each absorbed integral 611-626 is determined by taking an integral of the respective line 511-516 (shown in FIG. 5) that corresponds to the same temperature.

The vertical axis of the graph 600 plots the value of the absorbed integral 611-626 (in W/cm$^2$). The horizontal axis of the graph 600 plots the temperature (in ° C.) corresponding to each absorbed integral 611-626.

An emitted integral (not shown) is determined by taking an integral of a respective incident radiation curve 310-313 shown in FIG. 3. The incident radiation curves 310-313 are across the same range of wavelengths shown for FIGS. 4 and 5.

Figure 7:
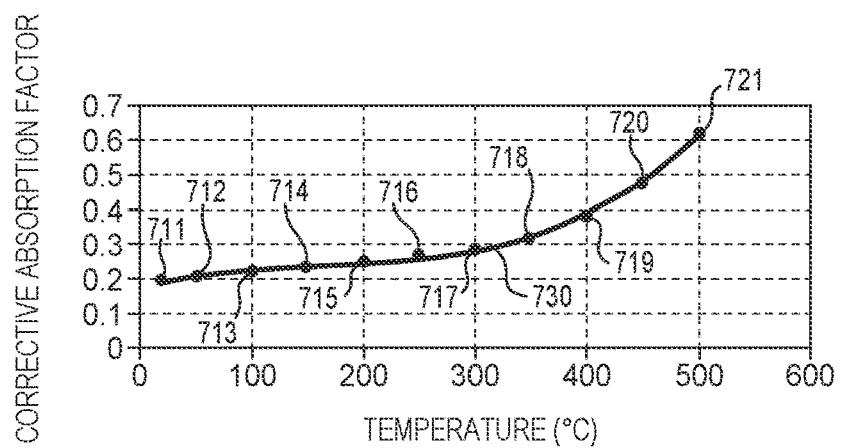
FIG. 7 is a schematic graphical view of a graph showing corrective absorption factor versus temperature, according to one implementation.

FIG. 7 is a schematic graphical view of a graph 700 showing corrective absorption factor versus temperature, according to one implementation. The graph 700 includes a plurality of corrective absorption factors 711-721. Each corrective absorption factor 711-721 corresponds to a temperature of the plurality of temperatures. Each corrective absorption factor 711-721 is determined by dividing the absorbed integral 611-626 (shown in FIG. 6) by the emitted integral for each temperature of the plurality of temperatures.

The vertical axis of the graph 700 plots the value of the corrective absorption factor 711-721. The horizontal axis of the graph 700 plots the temperature (in ° C.) corresponding to each corrective absorption factor 711-721. The plurality of corrective absorption factors 711-721 are plotted as part of a corrective absorption factor curve 730. The corrective absorption factor curve 730 is defined by a polynomial function.

A reflectivity of the substrate can be accounted for when determining the corrective absorption factors 711-721. The reflectivity can be known or can be measured. The corrective absorption factors 711-721 and the corrective absorption factor curve 730 are normalized using the reflectivity. For purposes of clarity, the reflectivity is assumed to be zero to generate the graph 700.

Figure 8:
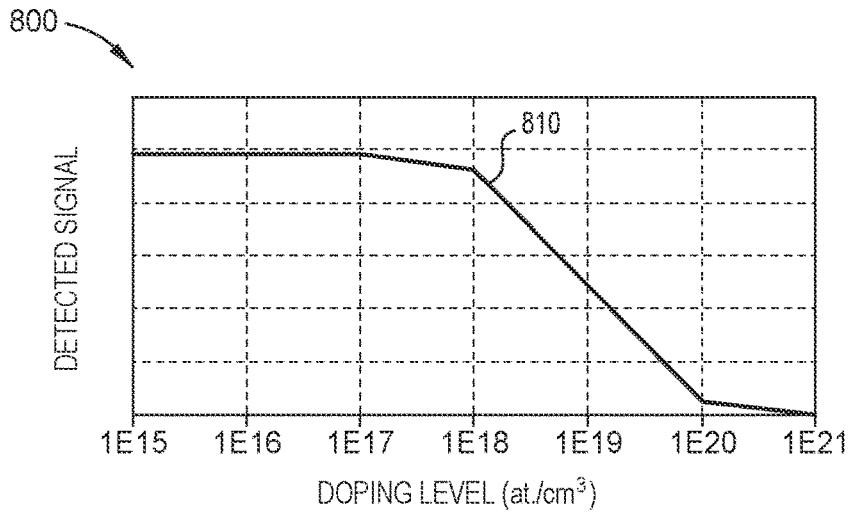
FIG. 8 is a schematic graphical view of a graph showing detected signal versus doping level, according to one implementation.

FIG. 8 is a schematic graphical view of a graph 800 showing detected signal versus doping level, according to one implementation. The vertical axis plots the detected signal of one or more radiation detectors that are detecting transmitted radiation transmitted through a substrate during thermal processing of the substrate. The detected signal can be detected by one or more photodetectors of the one or more radiation detectors. The horizontal axis, plots the doping level of the substrate being thermally processed.

As shown by the line 810 in the graph 800, substrates having a doping level of 1E18 or more transmit less radiation and absorb more radiation than substrates having lesser doping levels. As shown by the line 810 in the graph 800, substrates absorb more radiation at a higher rate as the doping level increases.

Aspects of the present disclosure facilitate heating substrates quickly and uniformly while facilitating substrate opacity to quickly absorb heat. Aspects of the present disclosure account for variances in different substrates, which can vary in doping and can vary as the substrates are heated. Benefits of the present disclosure include correcting non-uniformities in annealing, reduced probability of substrate movement and misalignment (such as becoming out-of-pocket), enhanced substrate uniformity, reduced substrate warpage, reducing costs and delays, reducing substrate defects, and increased throughput. Benefits also include efficiently, accurately, and uniformly heating a variety of different substrates to a target anneal temperature in a target time, such as to 400° C. in 25 seconds or less. Benefits also include using lower radiation wavelengths (such as less than 1 micron) and higher heat lamp powers for thermal processing.

Other attempts to address substrate non-uniformities for thermal processing are unpredictable and/or slow, causing operational delays. The method 200 is conducted in an open loop manner, which facilitates accuracy and reduced delays in thermal processing of substrates.

It is contemplated that one or more aspects disclosed herein may be combined. As an example, one or more aspects, features, components, and/or properties of the system having the chamber 100, the method 200, the graph 300, the graph 400, the graph 500, the graph 600, and/or the graph 700 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A system for processing substrates, comprising:
   a chamber comprising an internal volume;
   a substrate support;
   a plurality of heat lamps;
   one or more radiation detectors disposed on an opposing side of the substrate support relative to the plurality of heat lamps; and
   a controller comprising instructions that, when executed, cause a plurality of operations to be conducted, the plurality of operations comprising:
      heating a substrate across a plurality of temperatures using the plurality of heat lamps, the heating comprising directing an incident radiation to a receiving surface of the substrate across a plurality of wavelengths for each temperature of the plurality of temperatures,
      detecting a plurality of transmitted radiation values transmitted from a transmitting surface of the substrate across the plurality of wavelengths for each temperature of the plurality of temperatures,
      determining a plurality of absorptive factors across the plurality of wavelengths for each temperature of the plurality of temperatures,
      determining a plurality of absorbed power values across the plurality of wavelengths for each temperature of the plurality of temperatures;
      generating an absorbed power curve across the plurality of wavelengths for each temperature of the plurality of temperatures,
      generating a corrective absorption factor curve comprising a plurality of corrective absorption factors,
      identifying a classification of the substrate, and
      transforming the corrective absorption factor curve, the transforming comprising:
         comparing the corrective absorption factor curve with a stored corrective factor curve comprising a plurality of stored corrective factors, and
         merging the corrective absorption factor curve with the stored corrective factor curve to generate a transformed corrective factor curve.

2. The system of claim 1, wherein the generating the corrective absorption factor curve comprises:

determining an absorbed integral of the absorbed power curve for each temperature of the plurality of temperatures;
determining an emitted integral of an incident radiation curve of the incident radiation;
dividing the absorbed integral by the emitted integral for each temperature of the plurality of temperatures to determine the plurality of corrective absorption factors; and
plotting the plurality of corrective absorption factors as part of the corrective absorption factor curve.

3. The system of claim 2, wherein the plurality of operations further comprise thermally processing the substrate or a second substrate, the thermally processing the substrate or the second substrate comprising:
selecting a processing temperature and a radiation power corresponding to the processing temperature;
determining a corrected radiation power by dividing the radiation power by a corrective absorption factor disposed along the corrective absorption factor curve at the processing temperature; and
heating the substrate or the second substrate to the processing temperature by emitting the corrected radiation power from the plurality of heat lamps.

4. The system of claim 1, wherein the corrective absorption factor curve is defined by a polynomial function.

5. The system of claim 1, wherein the substrate is positioned at a distance relative to an upper surface of the internal volume during the heating of the substrate and the detecting of the plurality of transmitted radiation values, and the distance is 1 mm or less.

6. A method of correcting thermal processing of substrates, comprising:
heating a substrate across a plurality of temperatures, the heating comprising directing an incident radiation to a receiving surface of the substrate across a plurality of wavelengths for each temperature of the plurality of temperatures;
detecting a plurality of transmitted radiation values transmitted from a transmitting surface of the substrate across the plurality of wavelengths for each temperature of the plurality of temperatures;
determining a plurality of absorptive factors across the plurality of wavelengths for each temperature of the plurality of temperatures;
generating a corrective absorption factor curve comprising a plurality of corrective absorption factors; and
transforming the corrective absorption factor curve, the transforming comprising:
comparing the corrective absorption factor curve with a stored corrective factor curve comprising a plurality of stored corrective factors, and
merging the corrective absorption factor curve with the stored corrective factor curve to generate a transformed corrective factor curve.

7. The method of claim 6, further comprising:
determining a plurality of absorbed power values across the plurality of wavelengths for each temperature of the plurality of temperatures; and
generating an absorbed power curve across the plurality of wavelengths for each temperature of the plurality of temperatures.

8. The method of claim 7, wherein the generating the corrective absorption factor curve comprises:
determining an absorbed integral of the absorbed power curve for each temperature of the plurality of temperatures;
determining an emitted integral of an incident radiation curve of the incident radiation;
dividing the absorbed integral by the emitted integral for each temperature of the plurality of temperatures to determine the plurality of corrective absorption factors; and
plotting the plurality of corrective absorption factors as part of the corrective absorption factor curve.

9. The method of claim 8, further comprising thermally processing the substrate or a second substrate, comprising:
selecting a processing temperature and a radiation power corresponding to the processing temperature;
determining a corrected radiation power by dividing the radiation power by a corrective absorption factor disposed along the corrective absorption factor curve at the processing temperature; and
heating the substrate or the second substrate to the processing temperature by emitting the corrected radiation power from a plurality of heat lamps.

10. The method of claim 9, wherein the corrected radiation power has a wavelength that is less than 1 micron and a power that is 0.02 W/cm$^2$-nm or more.

11. The method of claim 6, wherein the corrective absorption factor curve is defined by a polynomial function.

12. The method of claim 6, wherein the substrate is a transparent or semitransparent substrate that is formed of one or more of silicon, carbon, germanium, phosphorus, polysilicon, oxide, nitride, metal film, or boron.

13. The method of claim 6, wherein an upper end of the plurality of temperatures is an opacity temperature for the substrate.

14. The method of claim 6, wherein the transforming the corrective absorption factor curve further comprises, for each corrective absorption factor of the plurality of corrective absorption factors:
determining a ratio of the corrective absorption factor relative to the stored corrective factor curve at the same temperature; and
ignoring the respective corrective absorption factor if the ratio is outside of a first acceptance range or within a second acceptance range that is narrower than the first acceptance range.

15. The method of claim 6, wherein the merging of the corrective absorption factor curve with the stored corrective factor curve comprises executing a machine learning model to generate the transformed corrective factor curve, and the machine learning model is a regression model.

16. A non-transitory computer readable medium for correcting thermal processing of substrates, the non-transitory computer readable medium comprising instructions that, when executed, cause a plurality of operations to be conducted, the plurality of operations comprising:
heating a substrate across a plurality of temperatures, the heating comprising directing an incident radiation to a receiving surface of the substrate across a plurality of wavelengths for each temperature of the plurality of temperatures;
detecting a plurality of transmitted radiation values transmitted from a transmitting surface of the substrate across the plurality of wavelengths for each temperature of the plurality of temperatures;
determining a plurality of absorptive factors across the plurality of wavelengths for each temperature of the plurality of temperatures;
generating a corrective absorption factor curve comprising a plurality of corrective absorption factors; and transforming the corrective absorption factor curve, the transforming comprising:
comparing the corrective absorption factor curve with a stored corrective factor curve comprising a plurality of stored corrective factors, and
merging the corrective absorption factor curve with the stored corrective factor curve to generate a transformed corrective factor curve.

17. The non-transitory computer readable medium of claim 16, wherein the plurality of operations further comprise:
determining a plurality of absorbed power values across the plurality of wavelengths for each temperature of the plurality of temperatures; and
generating an absorbed power curve across the plurality of wavelengths for each temperature of the plurality of temperatures.

18. The non-transitory computer readable medium of claim 17, wherein the generating the corrective absorption factor curve comprises:
determining an absorbed integral of the absorbed power curve for each temperature of the plurality of temperatures;
determining an emitted integral of an incident radiation curve of the incident radiation;
dividing the absorbed integral by the emitted integral for each temperature of the plurality of temperatures to determine the plurality of corrective absorption factors; and
plotting the plurality of corrective absorption factors as part of the corrective absorption factor curve.

19. The non-transitory computer readable medium of claim 18, wherein the plurality of operations further comprise thermally processing the substrate or a second substrate, comprising:
selecting a processing temperature and a radiation power corresponding to the processing temperature;
determining a corrected radiation power by dividing the radiation power by a corrective absorption factor disposed along the corrective absorption factor curve at the processing temperature; and
heating the substrate or the second substrate to the processing temperature by emitting the corrected radiation power from a plurality of heat lamps.

20. The non-transitory computer readable medium of claim 16, wherein the corrective absorption factor curve is defined by a polynomial function.

\* \* \* \* \*